(12) United States Patent
Liu et al.

(10) Patent No.: US 6,746,951 B2
(45) Date of Patent: Jun. 8, 2004

(54) BOND PAD OF SEMICONDUCTOR DEVICE AND METHOD OF FABRICATING THE SAME

(75) Inventors: Seong-ho Liu, Kuri (KR); Kyung-tae Lee, Kwacheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/906,303

(22) Filed: Jul. 16, 2001

(65) Prior Publication Data

US 2002/0047218 A1 Apr. 25, 2002

(30) Foreign Application Priority Data

Oct. 20, 2000 (KR) ............................ 2000-61989

(51) Int. Cl.⁷ .......................................... H01L 21/4763
(52) U.S. Cl. .................. 438/627; 438/597; 438/618; 438/622; 438/623; 438/628; 438/629; 438/633; 438/634; 438/637
(58) Field of Search ................. 438/597, 618, 438/622, 623, 627, 628, 629, 633, 634, 637

(56) References Cited

U.S. PATENT DOCUMENTS

6,255,586 B1    7/2001   Kim et al. ................. 174/52.1

*Primary Examiner*—Long Pham
(74) *Attorney, Agent, or Firm*—Mills & Onello LLP

(57) ABSTRACT

A bond pad of a semiconductor device capable of restraining dishing and having improved conductivity by a damascene technique using a copper pattern, includes first and second copper patterns of irregular lattice models, first and second dielectric layer patterns to connect the first and second copper patterns in the vertical direction, a line connection structure horizontally connecting the first and second copper patterns, and a conductivity improving layer formed on the first and second copper patterns. Dishing generated in planarizing the first and second copper patterns by a damascene technique can be restrained due to the first and second copper patterns of the lattice models. Also, the conductivity property of the bond pad can be improved by connecting the first and second copper patterns horizontally and in the vertical direction and further forming the conductivity improving layer on the first and second copper patterns.

9 Claims, 8 Drawing Sheets

BOND PAD OF SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly, to a bond pad of a semiconductor device formed by a damascene technique using copper and a method of fabricating the same.

2. Description of the Related Art

As the integration density of semiconductor devices increases, in the case of a logic semiconductor device requiring high integration and high operating speed, the thickness of a gate oxide layer and the size of a gate have been reduced to improve the operating speed. However, it is further effective to improve the operating speed of the logic semiconductor device by reducing the resistance of a line connected to the logic semiconductor device and the parasitic capacitance of an inter-metal dielectric layer.

To meet such a requirement, a copper pattern using a damascene technique has been applied. Generally, copper has a resistivity of 1.59 [$\mu \Omega \cdot cm$] while aluminum used as the existing line material has a resistivity of 2.66 [$\mu \Omega \cdot cm$]. The resistivity of copper is 60% lower than that of aluminum. Also, the cost of copper is lower than that of aluminum and the electro-migration life thereof is relatively long. Electro-migration is a phenomenon in which the metal line formed in a semiconductor device moves from one region to another or is bent due to heat and high current density. Consequently, copper is being considered as a next generation line material.

However, it is difficult to apply photolithographic and etch processes to a copper pattern. Therefore, when a copper pattern is applied to a semiconductor device, photolithographic and etch processes are not used. Instead, copper is filled into a dielectric layer by the damascene technique and polished by a chemical mechanical polishing process, thereby forming a copper pattern.

Figure 1:
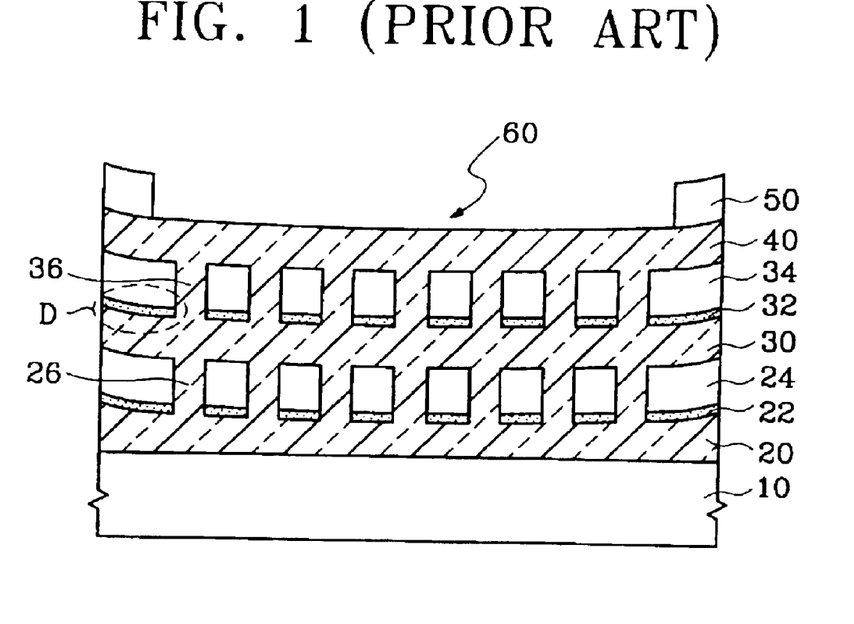
FIGS. 1 and 2 are a cross-sectional view and a plane view, respectively, illustrating a bond pad of a semiconductor device according to the prior art.
Figure 2:
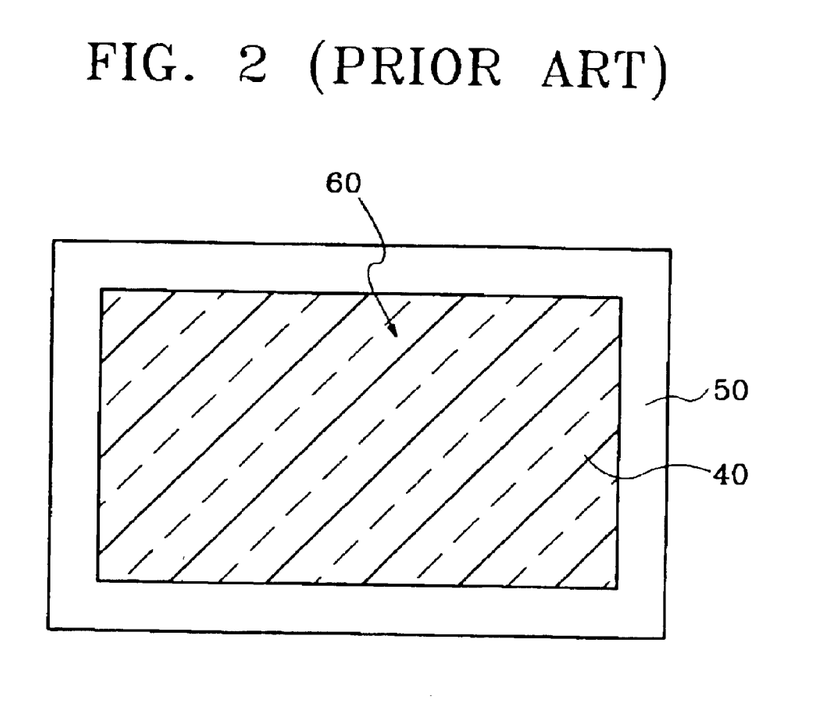

FIGS. 1 and 2 show cross-sectional and plane views, respectively, of a bond pad of a semiconductor device according to the prior art. Referring to FIGS. 1 and 2, multilayered copper patterns 20, 30, and 40 are formed on a semiconductor substrate 10. The multilayered copper patterns 20, 30 and 40 are electrically connected to one another through a plurality of plugs 26 and 36 formed at diffusion barrier layers 22 and 32 and inter-metal dielectric layers 24 and 34. The copper pattern 40, which is exposed at the top of the structure, is used as a bond pad 60, and a passivation layer 50 is formed on the copper pattern 40 to protect the semiconductor chip from external environmental effects.

If a broad metal line region such as the bond pad 60 is polished by chemical mechanical polishing, it is polished faster than other narrow metal line regions. As a result, dishing D occurs. Dishing is a structural phenomenon in which a broad metal line region is highly polished during a chemical mechanical polishing process, in which the broad metal line region is dented and a step difference is generated.

Such a step difference causes damage to peripheral circuits during the chemical mechanical polishing process. Also, in a case where a multilayered metal line is formed by continuous chemical mechanical polishing, the dishing generated in a broad metal line region such as the bond pad 60 is accumulated toward the upper layers. Consequently, it may cause serious problems to the planarization in the chemical mechanical polishing process.

SUMMARY OF THE INVENTION

To solve the above problems, it is an object of the present invention to provide a bond pad of a semiconductor device having means for restraining dishing generated in a chemical mechanical polishing process by dividing a copper pattern serving as a bond pad into several copper patterns and effectively preventing an increase in line resistance which would otherwise be caused by dividing the copper pattern.

It is another object of the present invention to provide a method of fabricating a bond pad of a semiconductor device.

Accordingly, to achieve the above first object, there is provided a bond pad structure of a semiconductor device. The bond pad structure includes a semiconductor substrate including a lower dielectric layer and a lower copper pattern, a first dielectric layer pattern formed in the semiconductor substrate with a contact hole connected to the lower copper pattern. A first copper pattern is filled into the first dielectric layer pattern by a damascene technique to be connected to the lower copper pattern. A second dielectric layer pattern of a second form different from the first dielectric layer pattern is formed on the first copper pattern and has a contact hole connected to the first copper pattern and a line connection structure horizontally connecting separated parts to one another. A second copper pattern is filled into the second dielectric layer pattern by a damascene technique to be connected to the first copper pattern. A passivation layer is formed on the second copper pattern, and a bond pad is formed by patterning a portion of the passivation layer. A conductivity improving layer is formed on the exposed second copper pattern of the bond pad.

In one embodiment, first, second, and third diffusion barrier layers made of nitride are formed on the lower copper pattern, the first copper pattern, and the second copper pattern, respectively.

The first and second dielectric layer patterns have structures in which the first and second copper patterns filled into the first and second dielectric layers are connected to each other in the vertical direction or the horizontal direction without separation.

The conductivity improving layer is formed of a material selected from the group consisting of Ta, TaN, Al, Ti, TiN, TaSiN, Au, W and Nb on the first and second copper patterns. Thus, the line resistance which would otherwise have increased when the first and second copper patterns having lattice models are made can be effectively reduced.

In accordance with the invention, there is also provided a method of fabricating a bond pad of a semiconductor device. A semiconductor substrate including a lower dielectric layer and a lower copper pattern is prepared. A first dielectric layer pattern is formed by stacking and patterning a first diffusion barrier layer on the semiconductor substrate and forming a dual damascene line. A first copper pattern is formed to fill the first dielectric layer by stacking a copper layer on the semiconductor substrate on which the first dielectric layer pattern is formed and performing a chemical mechanical polishing process. A second dielectric layer pattern is formed by stacking a second diffusion barrier layer on the semiconductor substrate on which the first copper pattern is formed and forming a dual damascene line. A second copper pattern is formed to fill the second dielectric layer by stacking a copper layer on the semiconductor substrate on which the second dielectric layer pattern is formed and performing a chemical mechanical polishing process. A conductivity improving layer is formed on a region in which a bond pad will be formed on the semiconductor substrate on which the second copper pattern is formed. The bond pad is formed to expose the conductivity improving layer pattern by forming and patterning a passivation layer on the semiconductor substrate on which the conductivity improving layer pattern is formed.

In accordance with the invention, another method of fabricating a bond pad of a semiconductor device is provided. A semiconductor substrate including a lower dielectric layer and a lower copper pattern is prepared. A first dielectric layer pattern is formed by stacking a first diffusion barrier layer on the semiconductor substrate and forming a dual damascene line. A first copper pattern is formed to fill the first dielectric layer by stacking a copper layer on the semiconductor substrate on which the first dielectric layer pattern is formed and performing a chemical mechanical polishing process. A second dielectric layer pattern is formed by stacking a second diffusion barrier layer on the semiconductor substrate on which the first copper pattern is formed and forming a dual damascene line. A second copper pattern is formed to fill the second dielectric layer by stacking a copper layer on the semiconductor substrate on which the second dielectric layer pattern is formed and performing a chemical mechanical polishing process. The second copper pattern on which a bond pad will be formed is opened by stacking and patterning a passivation layer. A conductivity improving layer is deposited on the semiconductor substrate and then is polished by chemical mechanical polishing. As a result, the conductivity improving layer is formed only in the bond pad.

The first and second dielectric layer patterns can have line connection structures horizontally connecting the separated first and second copper patterns filled into the first and second dielectric layer patterns.

In the method of forming the first and second copper patterns, a barrier layer can be formed on the first and second dielectric layer patterns, a copper seed layer is formed on the barrier layer and the seed layer is grown by an electroplating method.

The first and second dielectric layer patterns electrically connect the entire separated first and second copper patterns filled into the first and second dielectric layer patterns in the vertical direction. Preferably, a conductivity improving layer may be further formed on the first copper pattern.

According to the present invention, dishing, which occurs in a chemical mechanical polishing process, can be prevented by forming first and second copper patterns having lattice structures. Also, a line resistance is increased when the first and second copper patterns having lattice structures are formed. The line resistance can be reduced by first and second dielectric layers which connect the first and second copper patterns in the vertical or horizontal direction. In addition, the line resistance can be reduced by a line connection structure which connects the separated first and second copper patterns, horizontally, which are formed on the first and second dielectric layer patterns. Also, the line resistance can be reduced by a conductivity improving layer which is formed on the first and second copper patterns.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS OF THE INVENTION

Hereinafter, embodiments of the present invention will be described in detail with reference to the attached drawings. However, the embodiments of the present invention can be modified into various other forms, and the scope of the present invention must not be interpreted as being restricted to the embodiments. The embodiments are provided to more completely describe the present invention to those skilled in the art.

Bond Pad Structure of Semiconductor Device According to the Present Invention A bond pad structure of a semiconductor device according to the present invention will be described with reference to FIGS. 20 through 24.

Referring to FIGS. 20 through 24, the bond pad structure of the semiconductor device according to the present invention includes a semiconductor substrate 100 on which a lower dielectric layer 102 and a lower copper pattern 104 are formed. A first dielectric layer pattern 108C having a plurality of contact holes connected to the lower copper pattern 104 of the semiconductor substrate 100 forms dual damascene lines and has irregular lattice models therein. A first copper pattern 116 is electrically connected to the lower copper pattern 104 and filled into the first dielectric layer pattern 108C using the damascene technique. A second dielectric layer pattern 120C formed on the first copper pattern 116 has a plurality of contact holes connected to the first copper pattern 116, different lattice models from the lattice model of the first dielectric layer pattern 108C, and a line connection structure connecting separated lattice models to one another, horizontally. A second copper pattern 128 is electrically connected to the first copper pattern 116 and filled into the second dielectric layer pattern 120C using the damascene technique. A passivation layer 138A is formed over the second copper pattern 128. A bond pad 144 is formed by patterning a portion of the passivation layer. A conductivity improving layer 140 or 140A is formed on the second copper pattern 128 within the bond pad 144.

The aforementioned structure of the bond pad of the semiconductor device according to the present invention may further include first, second, and third Cu diffusion barrier layers 106A, 118A and 132A on the lower, first, and second copper patterns 104, 116 and 128, respectively.

Also, a conductivity improving layer made of the same material as the conductivity improving layers 140 and 140A at the top may be further included between the first copper pattern 116 and the second diffusion barrier layer 118A.

Also, in the case where the conductivity improving layers 140 and 140A are formed by an etch process, they are formed only on the second copper pattern 128. In the case where the conductivity improving layers 140 and 140A are formed by a chemical mechanical polishing process, they may not only be formed on the second copper pattern 128 but also extended to the patterned side wall of the passivation layer 138A.

A structural characteristic of the bond pad of the semiconductor device according to the present invention is that the first and second copper patterns 116 and 128 stacked on the lower copper pattern 104 become lattice models (See FIG. 16) due to the first and second dielectric layer patterns 108C and 120C. That is, the first and second dielectric layer patterns 108C and 120C, which separate the first and second copper patterns 116 and 128 into lattice models during the chemical mechanical polishing process for the damascene technique, serve as polishing stoppers. Therefore, the polishing stoppers divide the metal line layer for the bond pad into narrow metal line layers. In a case where the bond pad is formed by the damascene technique using copper, dishing can be prevented.

However, separating the bond pad into lattice models can prevent the dishing at the expense of including dielectric material in a conductive layer, thereby increasing line resistance. Such a disadvantage can be overcome by other characteristics of the present invention which will be described below.

Another structural characteristic of the bond pad of the semiconductor device according to the present invention is that the first and second dielectric layer patterns 108C and 120C, which are exposed to the outside to be made into lattice models, are different from each other. Consequently, the first and second copper patterns 116 and 128 filled into the first and second dielectric layer patterns 108C and 120C are connected to each other in the vertical direction due to different lattice models. Therefore, the first and second copper patterns 116 and 128 separated by the lattice models are electrically connected to each other in the vertical direction without any separation.

Assuming that the X axis is a horizontal direction, the Y axis is in the vertical direction, and the Z axis is into the page, the first and second copper patterns 116 and 128 are connected to each other in the Z axis direction although they are not connected to each other in the X axis direction.

Line connection structures (130 in FIG. 17) are formed both in the first and second dielectric layer patterns 108C and 120C. The first and second copper patterns 116 and 128 separated from each other due to their lattice models are connected to each other by such a line connection structure horizontally. Consequently, the line connection structure 130 prevents the separation of the conductive layer from the first and second copper patterns 116 and 128 even though the first and second dielectric layer patterns 108C and 120C become lattice models. Accordingly, an increase in the line resistance of the metal line can be prevented.

The conductivity improving layer 140 or 140A can electrically connect all of the second copper patterns 128 together which are separated from each other due to their structural characteristics, i.e., their lattice models. Such conductivity improving layers 140 and 140A are actually formed on the second copper pattern 128. Also, the conductivity improving layers 140 and 140A may be formed in various forms using a material which improves conductivity or a material having excellent conductivity and excellent adhesion, which improves a wire bonding property in a subsequent wire bonding process. The conductivity improving layers 140 and 140A may be made of a single conductive material such as Ta, TaN, Al, Ti, TiN, TaSiN, Au, W, and Nb or an alloy of one or more of these materials.

First Embodiment of Method of Fabricating Bond Pad of Semiconductor Device According to the Present Invention The copper patterns are formed by the dual damascene technique, but the conductivity improving layers are formed on the bond pad by an etch method. Shown in FIGS. 3 through 20 are drawings of the bond pad structure of the semiconductor device and the method of fabricating the same according to a first embodiment of the present invention.

Figure 3:
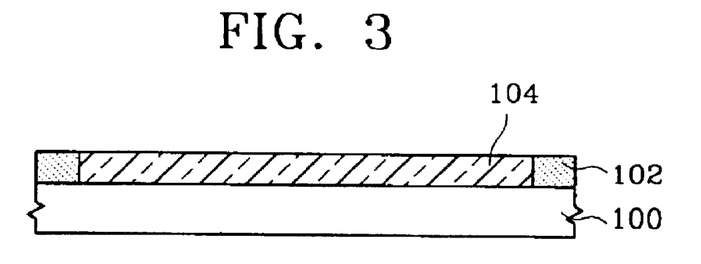
FIGS. 3 through 20 are drawings illustrating a bond pad structure of a semiconductor device and a method of fabricating the same according to one embodiment of the present invention.

With reference to FIG. 3, a lower structure such as a transistor (not shown) is formed on the semiconductor substrate 100 and a lower dielectric layer 102 is formed thereon. The lower dielectric layer 102 is patterned and a lower copper pattern 104 is formed in the patterned lower dielectric layer 102 by the damascene technique and subject to a chemical mechanical polishing process.

Figure 4:
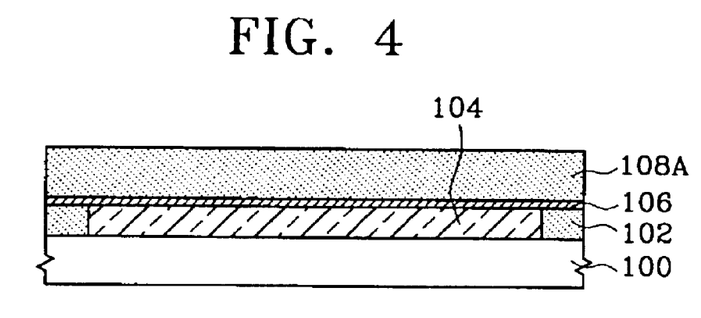

Referring to FIG. 4, a first diffusion barrier layer 106 made of nitride, which serves as a diffusion barrier to a copper metal line, is deposited on the entire surface of the semiconductor substrate 100. Then, a first dielectric layer 108A made of tera-ethyl-otho-silicate (TEOS) material, which serves as an inter-metal dielectric (IMD) layer, is deposited on the first diffusion barrier layer 106.

Figure 5:
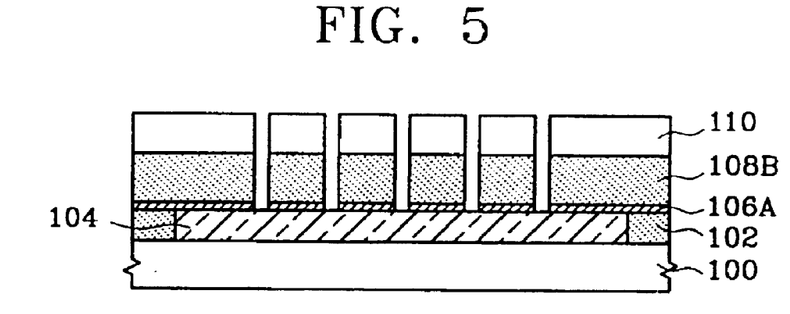

With reference to FIG. 5, a photo resist pattern 110 for forming contact holes is formed on the entire surface of the semiconductor substrate 100 on which the first dielectric layer 108A is formed. A first dielectric layer pattern 108B having contact holes is formed by etching the lower first dielectric layer 108A and the first diffusion barrier 106 and exposing the surface of the lower copper pattern 104.

Figure 6:
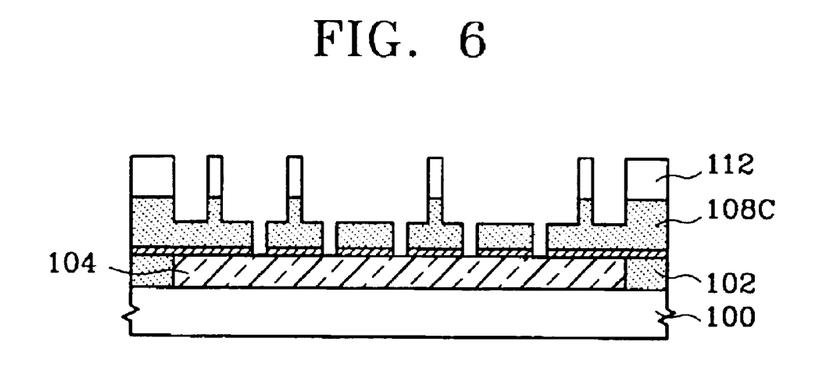

Referring to FIG. 6, another photoresist pattern 112 for forming a copper pattern by the dual damascene process is formed on the entire surface of the semiconductor substrate 100 on which the first dielectric layer pattern 108B is formed. A first dielectric pattern 108c is formed by partially etching the first dielectric layer pattern 108B using the photoresist pattern 112 as an etch mask, and then the photoresist pattern 112 is removed.

The first dielectric layer pattern 108C is a first structure of a lattice model, which electrically connects a second copper pattern filled into a second dielectric layer pattern made in a subsequent process with the first copper pattern filled into the first dielectric layer pattern 108C in the vertical direction. Also, the first dielectric layer pattern 108C may have a line connection structure in which the first copper patterns are connected horizontally.

Figure 7:
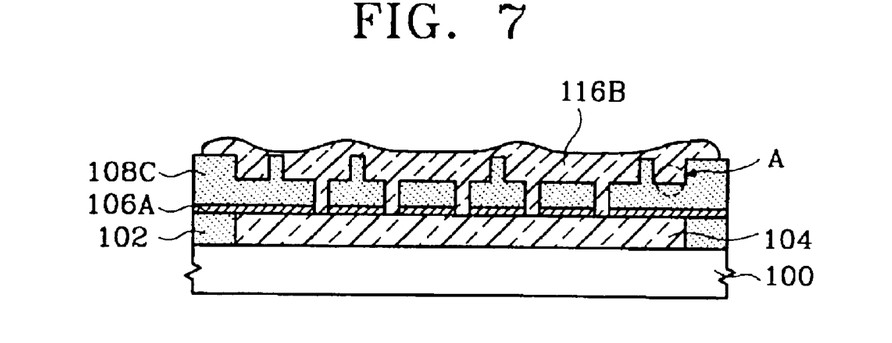
Figure 8:
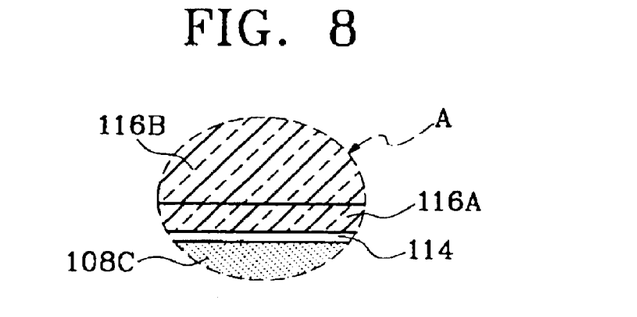

FIG. 7 shows a cross-sectional view in which a copper layer is stacked on the first dielectric layer pattern 108C, and FIG. 8 shows an enlarged cross-sectional view of part "A" of FIG. 7. With reference to FIGS. 7 and 8, a barrier layer 114 is formed of TaN on the entire surface of the semiconductor substrate, on which the first dielectric layer pattern 108C is formed, by a blanket method. Next, a copper seed layer 116A is formed on the barrier layer 114. Sequentially, a copper layer 116B for forming a first pattern 116 is formed by growing the copper seed layer 116A by an electroplating method so as to cover the surface of the semiconductor substrate.

Figure 9:
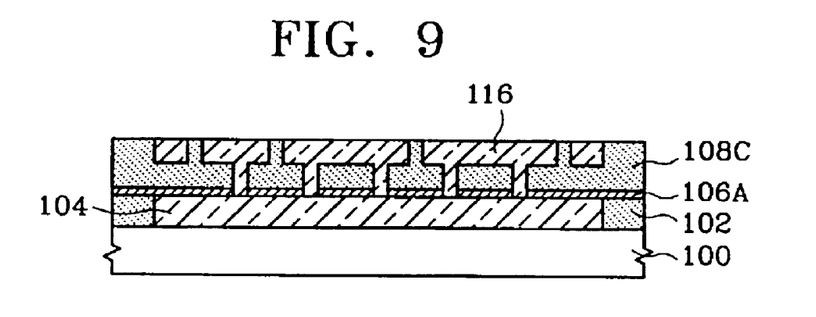

Referring to FIG. 9, the copper layer 116B for forming the first copper pattern 116 is polished by the chemical mechanical polishing process. During polishing, a portion of the first dielectric layer pattern 108C is exposed, since it serves as a polishing stopper while polishing the copper layer. Consequently, dishing is not generated in the first copper pattern 116, in which the metal line is broad.

Figure 10:
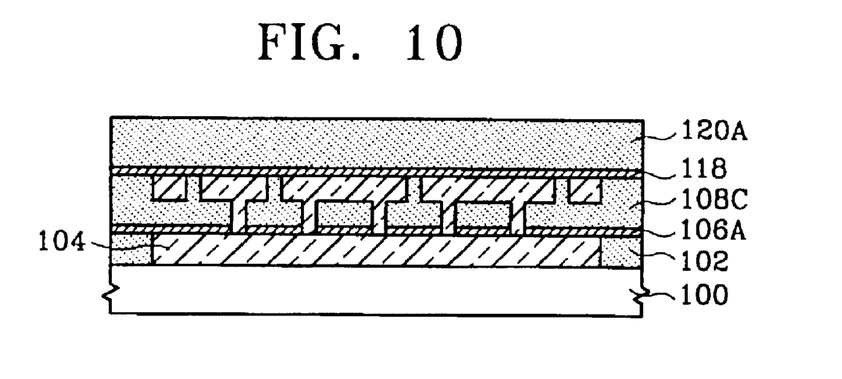

With reference to FIG. 10, a second diffusion barrier layer 118 is formed of nitride on the entire surface of the semiconductor substrate on which the chemical mechanical polishing for the first copper pattern 116 is completed. Next, a second dielectric layer 120A is deposited of TEOS on the second diffusion barrier layer 118.

Figure 11:
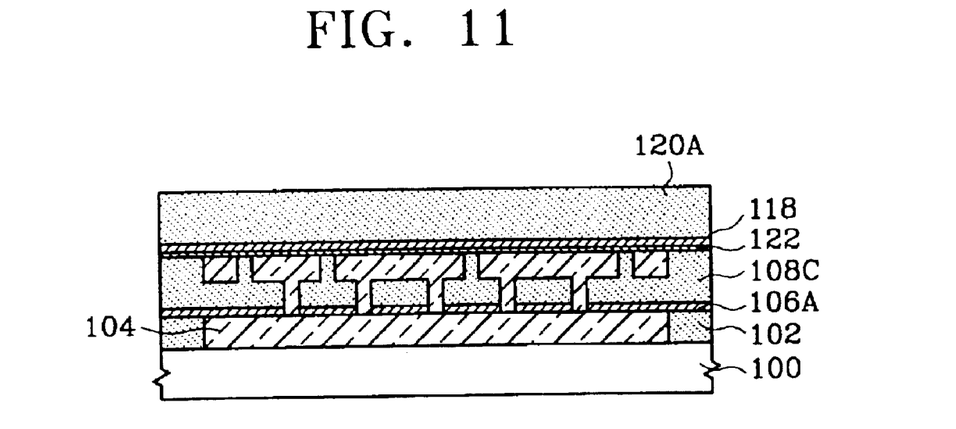

Referring to FIG. 11, a conductivity improving layer is not formed on the first copper pattern 116 of FIG. 10. However, as a variation of FIG. 10, a conductivity improving layer 122 may be formed of a single conductive material such as Ta, TaN, Al, Ti, TiN, TaSiN, Au, W, and Nb or an alloy of one or more of these materials between the first copper pattern 116 and the second copper pattern 118.

Figure 12:
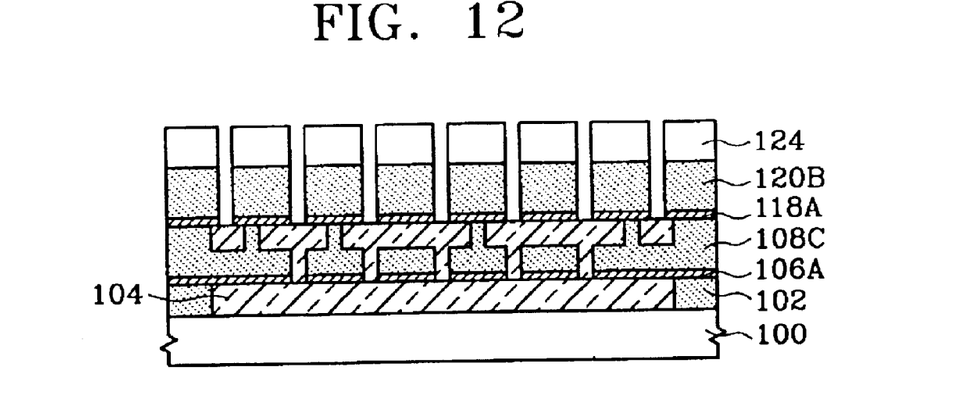

With reference to FIG. 12, a photoresist pattern 124 for forming contact holes connected with the first copper pattern 116 is formed on the entire surface of the semiconductor substrate on which the second dielectric layer 120A is formed. Next, the photoresist pattern 124 is used as an etch mask to etch the lower second dielectric layer 120A and the second diffusion barrier layer 118. A second dielectric layer pattern 120B having contact holes is formed by exposing the surface of the first copper pattern due to the etch.

Figure 13:
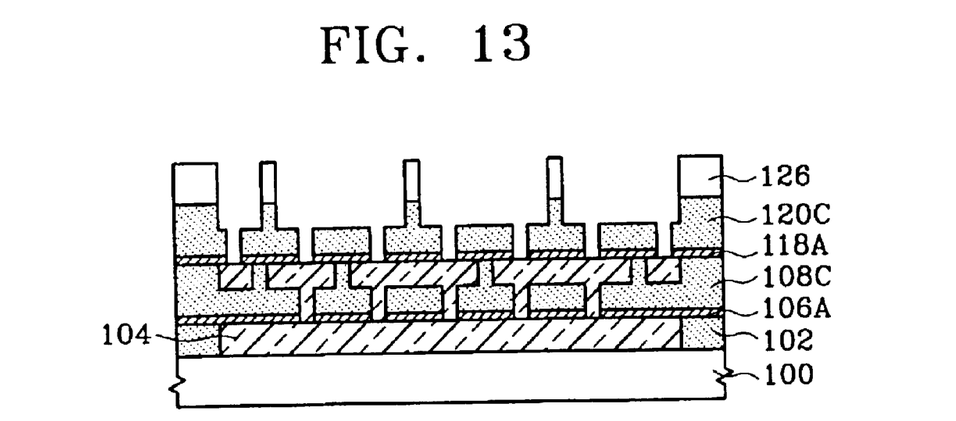

Referring to FIG. 13, another photoresist pattern 126 is formed on the semiconductor substrate, on which the second dielectric layer pattern 120B is formed, to make a second dielectric layer pattern 120C capable of forming a dual damascene line. The photoresist pattern 126 is used as an etch mask to form a final second dielectric layer pattern 120C by partially etching the lower second dielectric layer pattern 120B.

Figure 14:
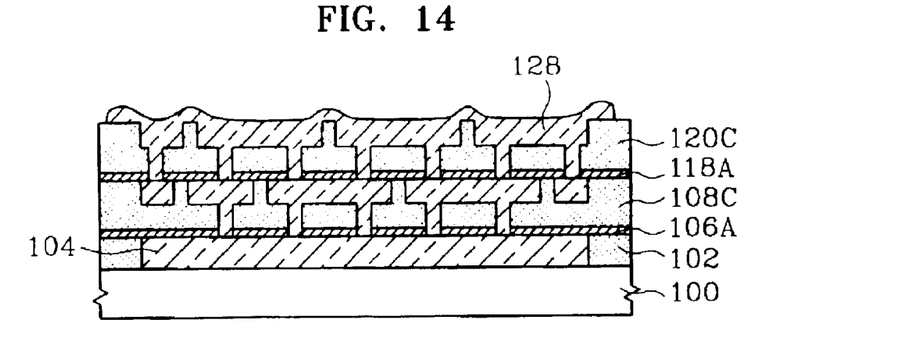

With reference to FIG. 14, the photoresist pattern 126 is eliminated by an ashing process and a copper layer for forming the second copper pattern 128 is formed by the same electroplating method as the first copper pattern 106.

Figure 15:
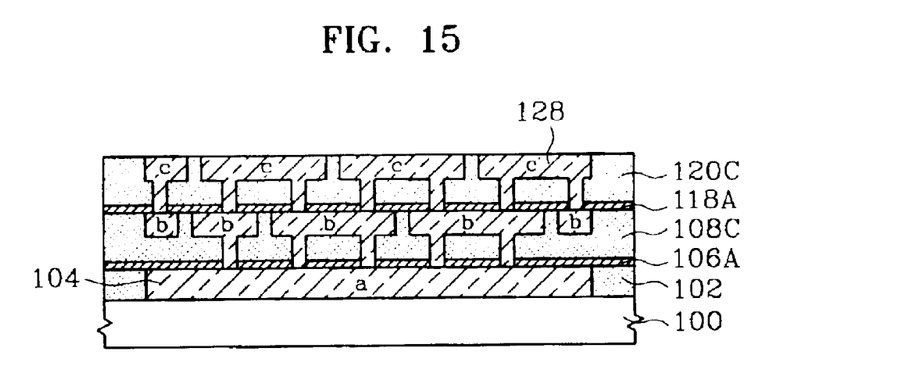

Referring to FIG. 15, the copper layer for forming the second copper pattern 128 is planarized by a chemical mechanical polishing process. The second dielectric layer pattern 120C of a lattice model also serves as a polishing stopper. Consequently, the generation and accumulation of dishing in the chemical mechanical polishing process can be prevented.

Herein, the first and second dielectric patterns 108C and 120C are different from each other in their lattice models as shown in the drawings. Consequently, using different lattice models of the first and second dielectric layer patterns 108C and 120C, region "a" in the lower copper pattern 104, region "b" in the first copper pattern 116, and region "c" in the second copper pattern 128 are electrically connected to one another in the X axis (horizontal) and Z axis (into the page) directions.

Figure 16:
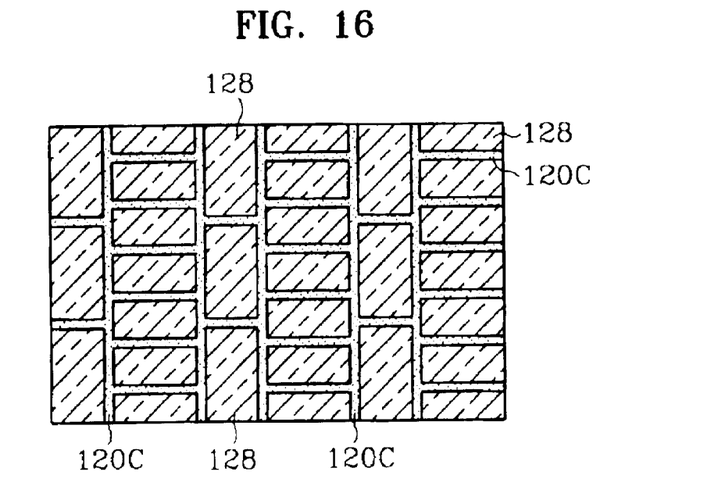

FIG. 16 shows a plane view in forming the second copper pattern 128 by chemical mechanical polishing. In this case, the line connection structure connecting the second copper pattern 128 of the lattice model horizontally is unused. Describing the form of the second copper pattern 128 on the plane, the copper pattern 128 becomes the lattice model due to the second dielectric layer pattern 120C.

In FIG. 15, the second copper pattern of one lattice model is electrically connected to the adjacent second copper pattern of the other lattice model in the vertical direction. The first dielectric layer pattern 108C applied to the first copper pattern 116 has the same structure as the second dielectric layer pattern 120C except that the arrangements of their respective lattice models are different.

Figure 17:
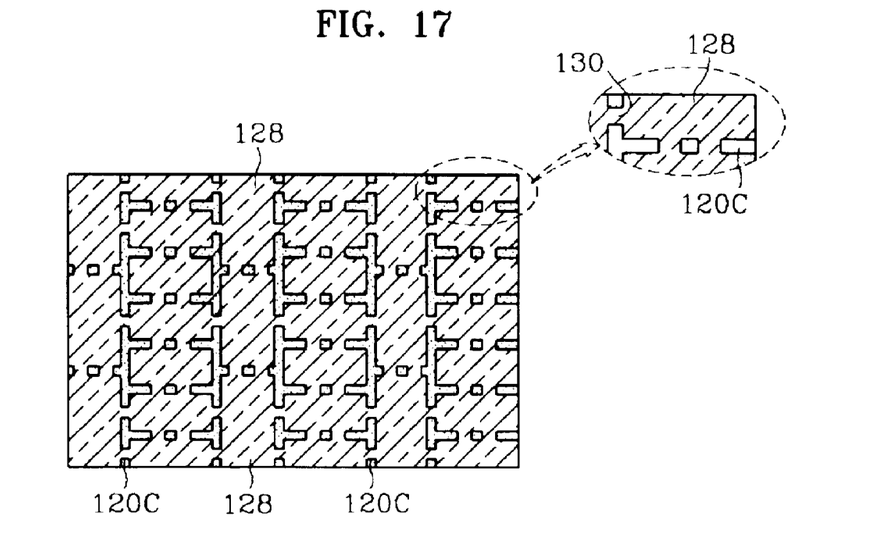

In FIG. 17, the line connection structure 130 is applied to the plane view of FIG. 16. As described in FIG. 15, the second copper patterns 128 of the separated lattice models are electrically connected to one another in the vertical direction. However, the line connection structures 130 are formed into the page, in the horizontal direction of the respective lattice models so that the second copper patterns 128 separated in the respective lattices are connected to one another.

Figure 18:
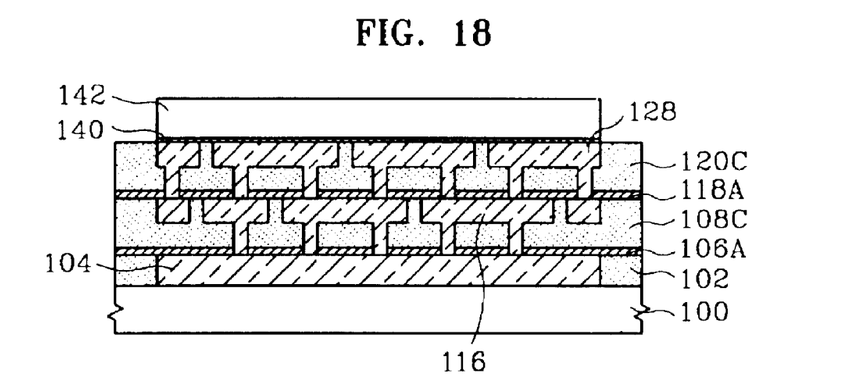

Referring to FIG. 18, a conductivity improving layer 140, for example, one selected from the group consisting of Ta, TaN, Al, Ti, TiN, TaSiN, Au, W, and Nb or an alloy containing at least one among such materials is stacked on the entire surface of the semiconductor substrate on which the second copper pattern 128 is formed. Next, a photoresist pattern 142 capable of patterning is formed so that the conductivity improving layer 140 is formed only on a region on which a bond pad will be formed. The photoresist pattern 142 serves as etch mask for etching the lower conductivity improving layer 140.

Figure 19:
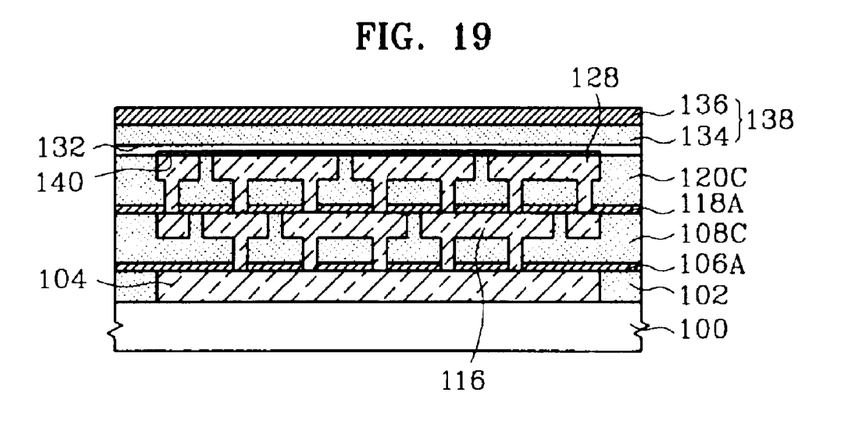

With reference to FIG. 19, the photo resist pattern 14 is eliminated. Then, a passivation layer 138 comprised of a multilayer of a third diffusion barrier layer 132, a TEOS layer 134 and a nitride layer 136 is stacked on the entire surface of the semiconductor substrate on which the conductivity improving layer 140 is formed.

Herein, the third diffusion barrier layer 132 may be omitted if necessary and the passivation layer 138 may be transformed into other forms instead of the multilayer form. For example, the passivation layer 138 may be formed in a single layer form such as the TEOS layer or the nitride layer or a multilayer form including any one of the TEOS layer and the nitride layer.

Figure 20:
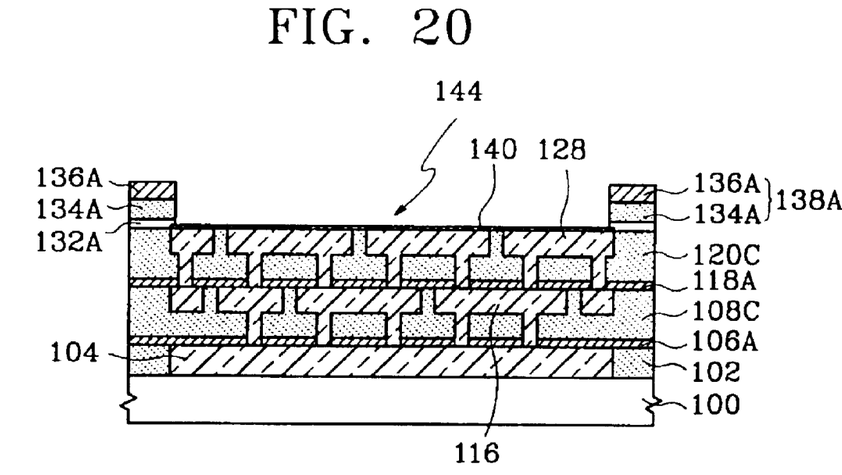

Referring to FIG. 20, a photoresist (not shown) for exposing a bond pad is formed on the entire surface of the semiconductor substrate on which the passivation layer 138 is formed. A bond pad 144, on which wire bonding may be performed, is formed by etching the lower passivation layer 138 and the third diffusion barrier layer 132. Consequently, the surface of the bond pad 144 has a structure in which the conductivity improving layer 140 is stacked on the second copper pattern 128 having the separated structure.

The conductivity improving layer 140 does not only have a function of reducing a line resistance increased by the combination of the separated second copper pattern but also other functions depending on the material of the conductivity improving layer 140. For example, in a case where Ti having excellent conductivity and adhesion is used as a main material of the conductivity improving layer 140, it can further increase bonding strength with a ball bond in bonding wires and be replaced with other material capable of easily forming an alloy with gold which is a material of the ball bond.

Second Embodiment for Method of Fabricating
Bond Pad of Semiconductor Device According to
the Present Invention In accordance with another embodiment, the copper pattern is formed by the dual damascene process while the conductivity improving layer is formed on a bond pad by a chemical mechanical polishing method. The formation method of FIGS. 3 to 17 is identical to the aforementioned first embodiment and therefore the description thereof will be omitted. However, in this embodiment, the formation method of FIGS. 21 through 24 is different from the first embodiment. In the interest of avoiding unnecessary repetition, only the differences between the first and second embodiments will be described.

Figure 21:
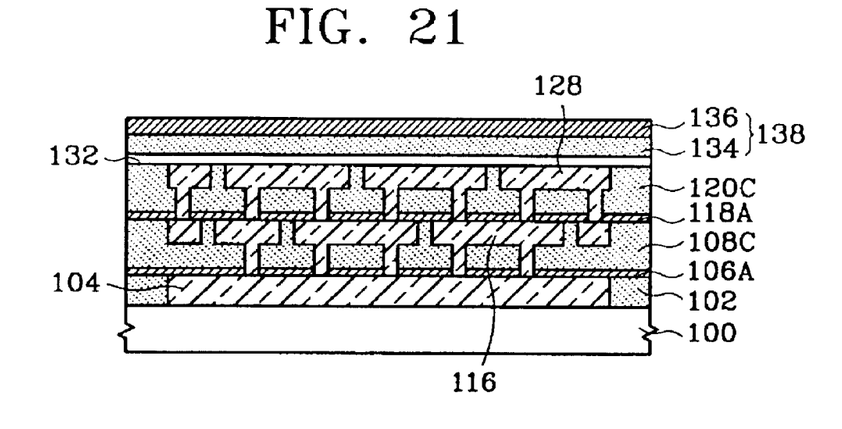
FIGS. 21 through 24 are drawings illustrating a method of fabricating a bond pad of a semiconductor device according to another embodiment of the present invention.

FIGS. 21 to 24 are drawings for describing the method of fabricating the bond pad of the semiconductor device according to the second embodiment of the present invention. Referring to FIG. 21, the method of fabricating the bond pad up until the second copper pattern 128 is the same as that in the aforementioned first embodiment. Next, the third diffusion barrier layer 132 comprising nitride is deposited on the entire surface of the semiconductor substrate on which the second copper pattern 128 is formed. The passivation layer 138 comprised of the stack layer of the TEOS layer 134 and the nitride layer 136 is stacked on the third diffusion barrier layer 132. Herein, the third diffusion barrier layer may be omitted if necessary. The passivation layer 138 may be a single layer of the TEOS layer or the nitride layer or a multilayer of only one layer.

Figure 22:
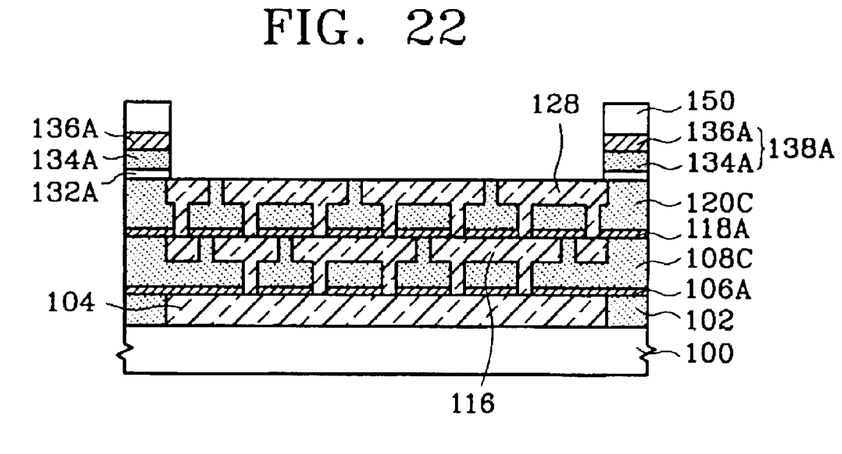

With reference to FIG. 22, a photoresist pattern 150 for forming a bond pad is formed on the entire surface of the semiconductor substrate on which the passivation layer 138 is formed. The photoresist pattern 150 is eliminated by etching the lower passivation layer 138 and the second diffusion barrier layer 132 using an etch mask.

Figure 23:
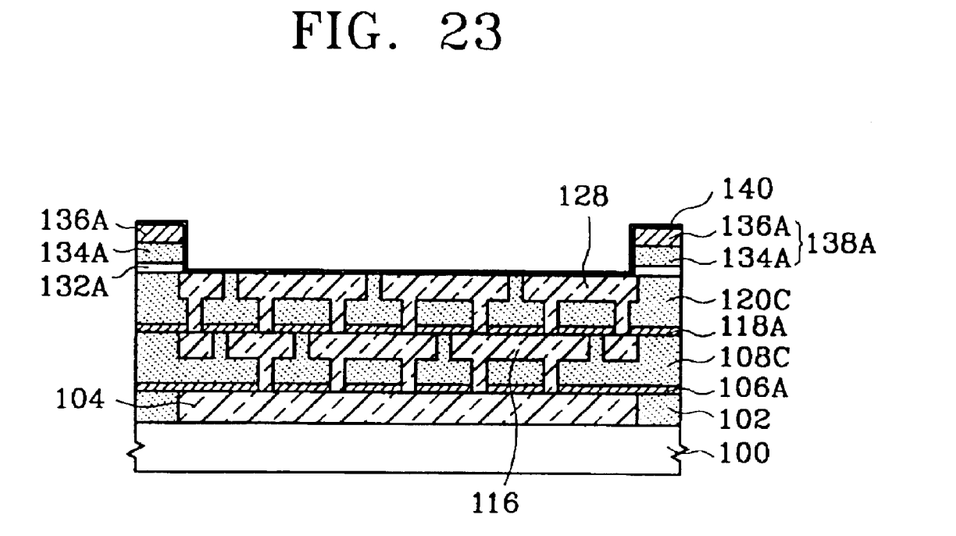

Referring to FIG. 23, the photoresist pattern 150 is eliminated from the resultant structure by an ashing process. Afterwards, the conductivity improving layer 140 is formed on the entire surface of the semiconductor substrate by a blanket method. The conductivity improving layer 140 may be made of one selected from the group consisting of Ta, TaN, Al, Ti, TiN, TaSiN, Au, W and Nb or an alloy including at least one of these materials.

Figure 24:
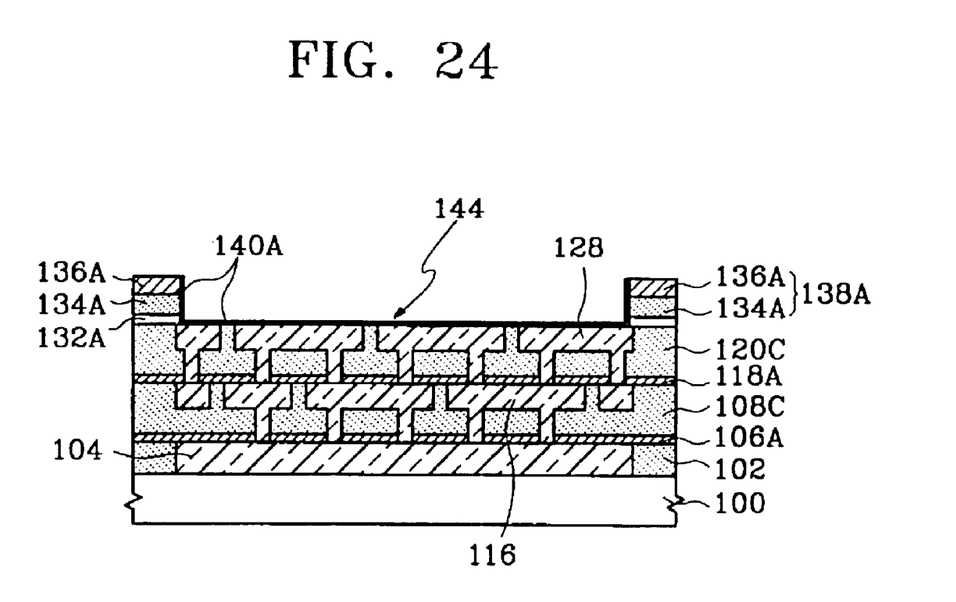

With reference to FIG. 24, the chemical mechanical polishing process is performed on the surface of the semiconductor substrate on which the conductivity improving layer 140 is formed. At this time, the nitride layer 136 of the passivation layer 138 serves as the polishing stopper. Consequently, the whole conductivity improving layer 140 on the passivation layer 138 is eliminated, and a conductivity improving layer 140A in a bond pad 144 is formed only on the passivation layer 138, the side wall of the third diffusion barrier layer 132 and the second copper pattern 128.

Consequently, according to the aforementioned present invention, first, the first and second copper patterns forming the bond pad become the lattice models so that dishing can be prevented. Second, the line resistance, which is increased in making the bond pad into the lattice model, can be reduced by means for connecting lines to one another vertically and horizontally.

While this invention has been particularly shown and described with references to preferred embodiments thereof, it will be understood by those skilled in the art that various changes in form and details may be made therein without departing from the spirit and scope of the invention as defined by the following claims.

For example, in the foregoing embodiments there are two separated copper patterns but there may be one or more than two. Both the copper pattern having a combined form in FIG. 1 and the separated copper pattern may be used. Also, the separated copper pattern may be formed by a dual damascene technique as well as a single damascene technique, and the dual damascene method may be also modified into other forms.

What is claimed is:

1. A bond pad structure of a semiconductor device, comprising:
    a semiconductor substrate including a lower dielectric layer and a lower copper pattern;
    a first dielectric layer pattern formed on the semiconductor substrate, in which first contact holes are formed to be vertically connected to the lower copper pattern and a first lattice structure is formed to be horizontally disposed on the first contact holes;
    a first copper pattern formed by a damascene technique in the first dielectric layer pattern and connected to the lower copper pattern such that the first copper pattern fills the first contact holes and the first lattice structure;
    a second dielectric layer pattern formed over the first copper pattern, in which second contact holes are formed to be vertically connected to the first copper pattern, and a second lattice structure different from the first lattice structure is formed to be horizontally disposed on the second contact holes;
    a second copper pattern formed by a damascene technique in the second dielectric layer pattern and connected to the first copper pattern such that the first copper pattern fills the second contact holes and the second lattice structure;
    a passivation layer formed on the second copper pattern;
    a bond pad formed by patterning a portion of the passivation layer; and
    a conductivity improving layer formed over the exposed second copper pattern of the bond pad.

2. The bond pad structure of claim 1, wherein first, second, and third diffusion barrier layers are formed on the lower copper pattern, the first copper pattern, and the second copper pattern, respectively.

3. The bond pad structure of claim 2, wherein the first, second, and third diffusion barrier layers comprise nitride.

4. The bond pad structure of claim 1, further comprising:
    a first line connection structure formed in the first dielectric layer pattern such that multiple portions of the first lattice structure are connected together horizontally when the first copper pattern is formed in the first dielectric layer pattern; and
    a second line connection structure formed in the second dielectric layer pattern such that multiple portions of the second lattice structure are connected together horizontally when the second copper pattern is formed in the second dielectric layer pattern.

5. The bond pad structure of claim 2, wherein a conductivity improving layer is formed between the first copper pattern and the second diffusion barrier layer.

6. The bond pad structure of claim 1, wherein barrier layers are formed at an interface between the first and second dielectric layer patterns and an interface between the first and second copper patterns.

7. The bond pad structure of claim 6, wherein the barrier layer comprises tantalum nitride (TaN).

8. The bond pad structure of claim 1, wherein the passivation layer is a single layer including any one of nitride, TEOS, and a multilayer structure.

9. The bond pad structure of claim 1, wherein the conductivity improving layer is made of a material selected from the group consisting of Ta, TaN, Al, Ti, TiN, TaSiN, Au, W and Nb.

* * * * *